(12) United States Patent
Gau et al.

(10) Patent No.: US 9,093,645 B2
(45) Date of Patent: Jul. 28, 2015

(54) MANUFACTURING METHOD OF THE ORGANIC SOLAR CELL

(71) Applicant: NATIONAL CHENG KUNG UNIVERSITY, Tainan (TW)

(72) Inventors: Chie Gau, Tainan (TW); Yu-Shun Cheng, Tainan (TW); Chih-Hung Chuang, Tainan (TW); Yu-Cheng Hong, Tainan (TW); Yung-Tsan Lin, Tainan (TW)

(73) Assignee: National Cheng Kung University, Tainan (TW)

( * ) Notice: Subject to any disclaimer, the term of this patent is extended or adjusted under 35 U.S.C. 154(b) by 189 days.

(21) Appl. No.: 14/026,194

(22) Filed: Sep. 13, 2013

(65) Prior Publication Data

US 2015/0013757 A1    Jan. 15, 2015

(30) Foreign Application Priority Data

Jul. 11, 2013   (TW) .............................. 102124856 A

(51) Int. Cl.
*H01L 51/44*   (2006.01)
*H01L 51/00*   (2006.01)

(52) U.S. Cl.
CPC .......... *H01L 51/0003* (2013.01); *H01L 51/442* (2013.01)

(58) Field of Classification Search
CPC .... H01L 51/441; H01L 51/445; H01L 51/424
USPC ........................................................ 136/263
See application file for complete search history.

(56) References Cited

FOREIGN PATENT DOCUMENTS

WO    WO 2013-144687    * 11/2012

* cited by examiner

*Primary Examiner* — Jayne Mershon
(74) *Attorney, Agent, or Firm* — Rosenberg, Klein & Lee

(57) ABSTRACT

The invention relates to a manufacturing method of an organic solar cell. First deposit in order a first electrode and a first transmission layer on a substrate. Then coat a photoresist layer having a preferred thickness ranging from 1000 nm to 1600 nm on the surface of the first transmission layer by a spin coater at a preferred spin-coating speed ranging from 3000 rpm and 6000 rpm for 30 seconds. Then develop an area by a photolithograph process, and coat an organic active layer in the area and on the surface of the photoresist layer by use of the spin coater at a preferred spin-coating speed ranging from 500 rpm and 800 rpm, in which the organic active layer has a thickness ranging from 230 nm to 320 nm at 500 rpm. Final deposit a second transmission layer and a second electrode on the organic active layer to obtain the organic solar cell.

9 Claims, 4 Drawing Sheets

MANUFACTURING METHOD OF THE ORGANIC SOLAR CELL

BACKGROUND OF THE INVENTION

1. Fields of the Invention

The present invention relates to a manufacturing method of the organic solar cell, especially by means of an application about the photoresist spin-coating and photolithograph technologies to balance the thickness and flatness of the organic active layer, and it effectively enhances the photoelectric conversion efficiency of the organic solar cell.

2. Descriptions of Related Art

The sun is the source of life, and human being cannot live without the sun. Although there are no immediately exhausted crises for the fossil fuels, e.g. oil or coal, on which the life around the world rely, the carbon dioxide emission from the excessive use of the fossil fuel has already caused the serious greenhouse effect to become the culprit in the earth's warming temperatures. Furthermore, as the price of crude oil continued to rise in recent years, looking for alternative energy sources has become imperative. Alternative energy sources, such as wind, hydro, geothermal, biodiesel, solar cells and so on, to be called as green energy, have attracted considerable attention over recent years, among which the solar cell is the most promising due to its high theoretical efficiency and mature technology.

The solar cell can transform the solar energy into electrical energy based on the photoelectric effect of materials. The photoelectric effect is the phenomenon that light shines into the material to increase conductive carriers. In terms of the semiconductor materials, as the energy of the light is larger than the energy gap of the semiconductors, the free elector-hole pairs are generated in the interior. However, these elector-hole pairs can be recombined soon or captured by the carriers in the semiconductors to become vanished. If an internal electric field is applied at this time, the carriers will be quickly led out before vanished. The internal electric field is generated in the joint interface between p-type and n-type semiconductors, and a so-called solar cell uses the internal electric field to extract effectively the current to induce the electricity.

According to the efficiency and production costs of the solar cell, the solar cell can be divided into three generations in development thereof, the first generation solar cell mainly made of silicon wafers with an efficiency over 20% shows disadvantages of a higher production cost and difficultly refining the silicon wafers, which results in a second generation solar cell. The second generation solar cell is mainly made for reducing the silicon content or made of cheaper materials, e.g. Cadmium Antimonide (CdTe) and Copper Indium Selenide ($CuInSe_2$) or the like, with an efficiency identical to that of the first generation. The third generation solar cell is developed for two specific purposes, one for an high conversion efficiency and the other for reduction of production costs by creation of an appropriate efficiency ranging from 15% to 20%. In terms of the conversion efficiency enhancement, although the solar cell having a conversion efficiency up to 30% by use of the multi-layers of different semiconductor materials to absorb respectively sunlight of different wavelengths has been already developed, its high production cost is still an issued to be unresolved. On the other hand, using the organic materials to produce the third generation solar cell shows the advantages of lower production costs and simpler processes. Although the conversion efficiency of the solar cell is low, it has a very good potential in application and development thereof.

The biggest advantage of the polymer organic solar cell is to use the solution process, such as spin coating and inkjet coating methods. In an existing technology, the bulk heterojunction blend process is most commonly used in production thereof. Particularly, a solution blended with conjugated polymer (P3HT) as the donor and phenyl-C61-butyric acid methyl ester (PCBM) as the acceptor is widely used to form an organic active layer over a substrate by a spin coater, a prepared solution for the organic active layer is dropped to form an uniform film on the substrate by a centrifugal force. There are only two deposition parameters in the spin coater, one for the spin-coating speed and the other for the spin-coating time. When the spin-coating speed gets higher, the film will get thinner and more uniform. However, obtaining a thinnest or thickest film will become an issue to be resolved. For example, the thinner the film is, the higher the spin-coating speed is, but subject to a speed limit of the spin coater; on the contrary, the thicker the film is, the lower the spin-coating speed is, but subject to unfavorable conditions of the film not spinning out at a lowest spin-coating, the liquid having a viscous force to make the four sides of the substrate become thicker, and the liquid flowing back to the inside of the substrate to make an uneven film in thickness when the spin coater stops. In researches, it is found that when the organic active layer gets thicker, there is a higher current density in measurement of current-voltage characteristics, which can further infer that there are many electron-hole pairs generated from the organic active layer. However, due to the unfavorable conditions occurred at a lower and lower spin-coating speed as aforesaid, the surface of the active layer will have a higher roughness. Also, a higher current density is easy to cause the defects of the organic active layer, so that fill factors (FF) will become poorer in the organic active layer and the overall efficiency of the solar cell will be relatively reduced. When the spin-coating speed for coating the organic active layer increases, the fill factors will increase to make the overall efficiency of the solar cell relatively stable, but the thickness of the organic active layer will be reduced to further result in the current density reduction. Thus there is a need for the organic solar cell vendors and educators to find a solution for an organic solar cell having a high performance under the conditions of unchanging the original materials of the organic active layer, obtaining a higher current density and promoting the fill factor efficiency.

SUMMARY OF THE INVENTION

Therefore it is a primary object of the present invention to provide a manufacturing method of the organic solar cell, especially by means of an application for the photoresist spin-coating and the photolithograph technologies to balance the thickness and flatness of the organic active layer, and it can enhance both performance of the current density and fill factor at the same time in order to enhance effectively the photoelectric conversion efficiency of the organic solar cell.

In order to achieve the above object, a manufacturing method of the organic solar cell in the present invention includes following steps. First deposit in order a first electrode and a first transmission layer on a substrate. Then coat a photoresist layer having a preferred thickness ranging from 1000 nm to 1600 nm on the surface of the first transmission layer by use of a spin coater at a preferred spin-coating speed ranging from 3000 rpm to 6000 rpm for 30 seconds. Then develop an area by a photolithograph process, and coat an organic active layer in the area and on the surface of the photoresist layer by use of the spin coater at a preferred spin-coating speed ranging from 500 rpm to 800 rpm, in which the organic active layer has a thickness ranging from 230 nm to 320 nm at 500 rpm. Final deposit a second transmission layer and a second electrode on the organic active layer to obtain the organic solar cell.

The current density ($J_{sc}$) of the organic solar cell is between 9 mA/cm$^2$ and 12 mA/cm$^2$, and the device efficiency of the organic solar cell is between 3.17% and 3.85%. One important point is that above current density performance is a better statement of the embodiment in the present invention. According to the spirit of the present invention, it can be used for a variety of changes or modifying the embodiments, and the people who are familiar with this art should understand that the present invention can be composed by a variety of materials and be set up in a variety of measuring equipment, and it does not affect the implementation of the present invention, and the effect from the structure and the advantages from the technology are the same as the present invention, they shall be regarded as the equivalent change and modification to the present invention. Therefore, the current density performance of the structure with adding the photoresist layer can be improved more than 1 mA/cm$^2$, and the device efficiency can be improved more than 1%.

The first electrode is made of indium tin oxide (ITO). The first transmission layer is made of zinc oxide (ZnO). The organic active layer is blended with conjugated polymer (P3HT) and phenyl-C61-butyric acid methyl ester (PCBM). The second transmission layer is made of conductive polymer (PEDOT: PSS). The second electrode is an anode used a silver ingot as the material coated by thermal evaporation.

Accordingly, the present invention uses the structure formed by the photoresist layer to make the organic active layer coated on it to have thicker thickness by the surface tension and viscosity of the solution, thus the spin-coating speed can be raised to balance the thickness and flatness of the organic active layer, that is, forming a structure layer before the organic active layer to improve the thickness of it under the premise without influencing flatness. Further, due to the present invention improves the thickness and the surface morphology of the organic layer, it is suitable to any organic materials, which has a high industrial applicability. Furthermore, the light-emitting mechanism of the organic light emitting diode (OLED) is opposite to the organic solar cell, so the present invention has the associated application in the organic light-emitting diode industry.

Further, the present invention further provides an organic solar cell structure which is manufactured by the method of above embodiment.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

First, in the following description of the embodiment, it should be understood that when a layer (or film) or a structure is deposited on or under the other substrate, another layer (or film) or another structure, it can be directly deposited in the other substrate, layer (or film), or another substrate, or there are one or more intermediate layers to deposit between both with indirect method. Please refer to the location of each layer in brief description of the figures.

Figure 1:
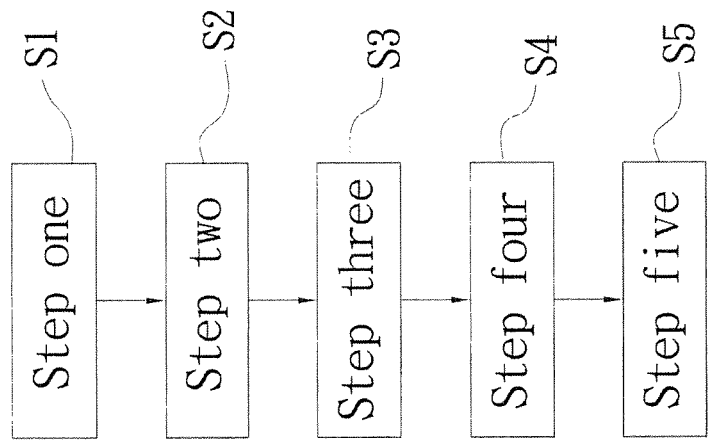
FIG. 1 is a flow chart showing steps of an embodiment of a manufacturing method of the organic solar cell according to the present invention.
Figure 2:
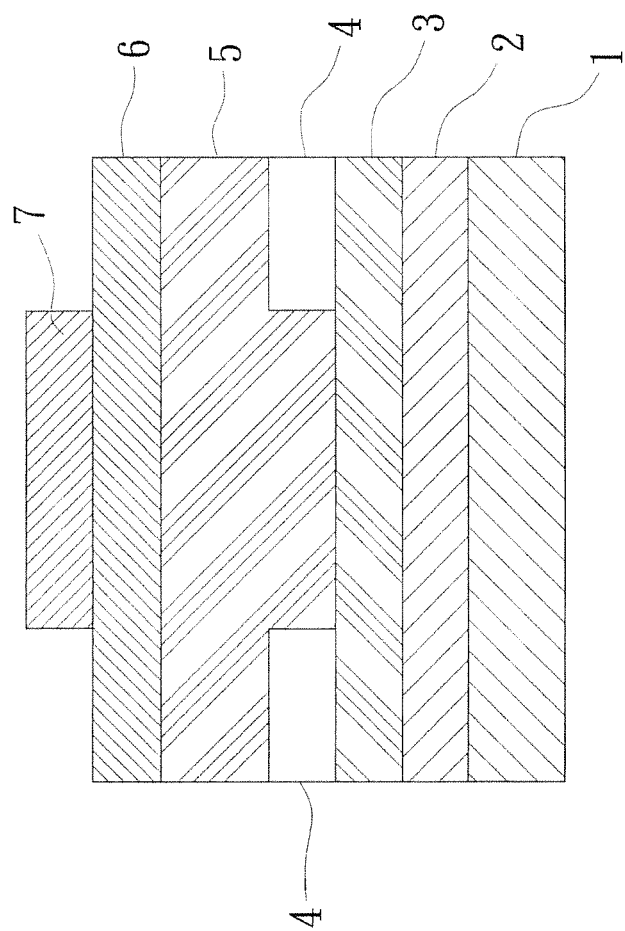
FIG. 2 is a schematic cross-sectional drawing showing the organic solar cell structure of an embodiment to the present invention.

Please refer to FIG. 1, a manufacturing method of the organic solar cell according to the present invention includes following steps.

Step one (S1): depositing in order a first electrode 2 and a first transmission layer 3 on a substrate 1.

Step two (S2): coating a photoresist layer 4 having a preferred thickness ranging from 1000 nm to 1600 nm on the surface of the first transmission layer 3 by use of a spin coater at a preferred spin-coating speed ranging from 3000 rpm to 6000 rpm for 30 seconds.

Step three (S3): developing an area by a photolithograph process.

Step four (S4): coating an organic active layer 5 in the area and on the surface of the photoresist layer 4 by use of the spin coater at a preferred spin-coating speed ranging from 500 rpm to 800 rpm, in which the organic active layer 5 has a preferred thickness ranging from 230 nm to 320 nm at 500 rpm.

Step five (S5): depositing in order a second transmission layer 6 and a second electrode 7 on the organic active layer 5 to obtain the organic solar cell.

In addition, the current density of the organic solar cell is between 9 and 12 mA/cm$^2$, and the device efficiency is between 3.17% and 3.85%. One important point is that above current density performance is a better statement of the embodiment in the present invention. According to the spirit of the present invention, it can be used for a variety of changes or modifying the embodiments, and the people who are familiar with this art should understand that the present invention can be composed by a variety of materials and be set up in a variety of measuring equipment, and it does not affect the implementation of the present invention, and the effect from the structure and the advantages from the technology are the same as the present invention, they shall be regarded as the equivalent change and modification to the present invention. Therefore, the current density performance of the structure with adding the photoresist layer 4 can be improved more than 1 mA/cm$^2$, and the device efficiency can be improved more than 1%.

Moreover, the first electrode 2 is made of indium tin oxide (ITO), which has high light-transmittance and high electrical conductivity. It can be sputtered on the glass and the soft plate of the substrate 1 as the conductive anode.

In addition, the first transmission layer 3 is made of zinc oxide (ZnO). Because the organic solar cell structure is constituted by a multilayer film, the control of the energy gaps between these layers is very important. The first electrode 2 plays the role of the electron collection, but ITO is a metal oxide with high work function, it is against the electron transport in the structure. Therefore, the energy gap of the first transmission layer 3 of ZnO can match with the organic active layer 5 and the first electrode 2, and it also has a good electron transport capability.

In addition, the organic active layer 5 of the organic solar cell uses the solution as the light-absorbing layer blended with the conjugated polymer (P3HT) as the donor and the phenyl-C61-butyric acid methyl ester (PCBM) as the acceptor. It blends with the donor and the acceptor to increase the interface of the organic active layer 5 in order to separate more electrons and holes.

Furthermore, the second transmission layer 6 is made of conductive polymer (PEDOT: PSS), its purpose is to do a hole transmission layer to make the hold separated from the organic active layer 5 to flow effectively to the first electrode 2 through the first transmission layer 3 of the anode, and to stop the electron flowing to the first electrode 2, thus to enhance the performance of the organic solar cell.

Furthermore, the second electrode 7 is an anode used a silver ingot as the material coated by thermal evaporation. The metal electrode has good stability in the atmosphere, and it is less susceptible to the impact of water and oxygen. It enhances effectively the life of the device in the atmosphere and increases the convenience of the research.

Furthermore, the organic active layer 5 of the organic solar cell manufactured by the bulk heterojunction (BHJ) absorbs external light to produce the excitons. The excitons will reach the interface between the donor and acceptor through the diffusion. Because the donor has a high electron affinity, the electrons and holes are separated by the energy of the excited state electrons transferred to the donor with a very quick process. After separating the electrons and holes, the electrons transfer through the electron transmission layer of the first transmission layer 3, and also stop the holes transmission, in order to prevent the recombination of the electrons and holes. The holes transfer through the hole transmission layer of the second transmission layer 6, and stop the electrons transmission at the same time, thus there is no any leakage current, and the fill factor is improved. After the electrons and holes passing to the respective cathode and anode to form the voltage difference and to produce the photoelectric conversion efficiency, where the fill factor of the organic solar cell becomes larger, the performance of the battery will close to the ideal condition.

Figure 3:
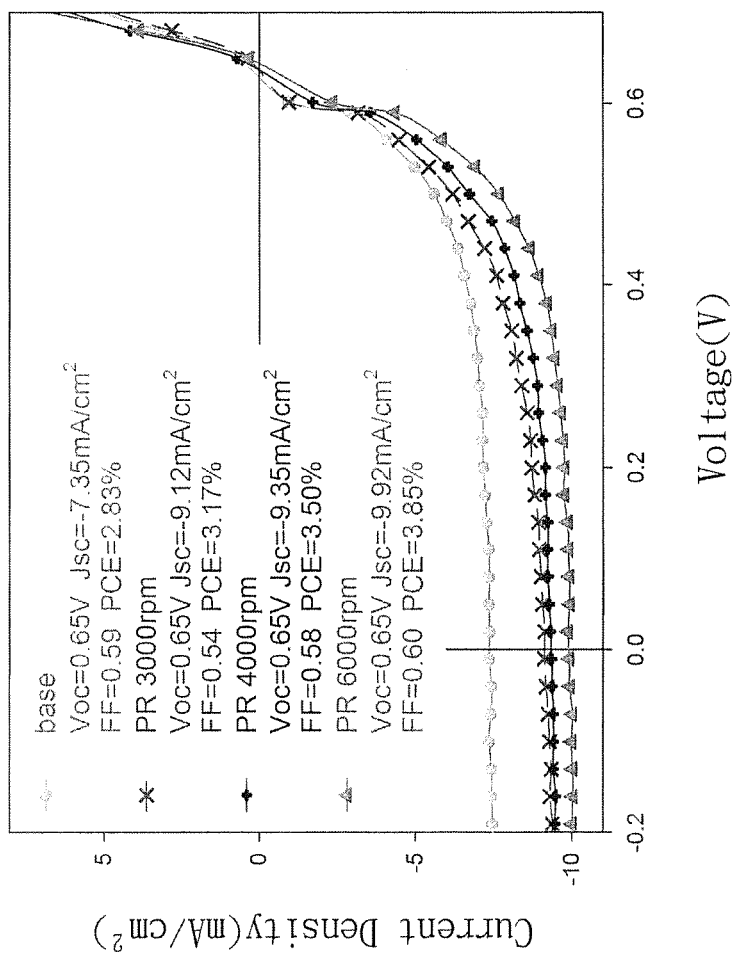
FIG. 3 is a voltage and current density diagram of an embodiment of a manufacturing method of the organic solar cell according to the present invention.

The present invention uses the structure formed by the photoresist layer 4 to make the organic active layer 5 coated on it to have thicker thickness by the surface tension and viscosity of the solution, thus the spin-coating speed can be raised to balance the thickness and flatness of the organic active layer 5. Please refer to FIG. 3, a voltage and current density diagram of an embodiment of a manufacturing method of the organic solar cell according to the present invention, where the circular segment indicates the device without coating the photoresist layer 4 (base), and the cross segment indicates that the photoresist layer 4 is coated by 3000 rpm spin-coating speed expressed as PR 3000 rpm, the plus segment indicates that the photoresist layer 4 is coated by 4000 rpm spin-coating speed expressed as PR 4000 rpm, the triangular segment indicates that the photoresist layer 4 is coated by 6000 rpm spin-coating speed expressed as PR 6000 rpm, and the horizontal axis represents the voltage and the vertical axis represents the current density, in which Voc is voltage, Jsc is current density, FF is fill factor, and PCE is device efficiency. From the figure showing, when the organic active layer 5 is under the same condition with 500 rpm spin-coating speed, the device without coating the photoresist layer 4 has 7.35 mA/cm$^2$ current density and 0.59 fill factor, and the current density can be dramatically increased when adding the photoresist layer 4. It also can be found from the figure that the current density increases when the photoresist layer 4 spin-coating speed increases, that is, when the spin-coating speed of the photoresist layer 4 is increased from 3000 rpm to 6000 rpm, the current density is improved from 9.12 mA/cm$^2$ to 9.92 mA/cm$^2$, and the device efficiency is improved from 2.83% to 3.85%. The data proves that adding the photoresist layer 4 and modifying appropriately its thickness enhances effectively overall photoelectric conversion efficiency of the organic solar cell.

Figure 4:
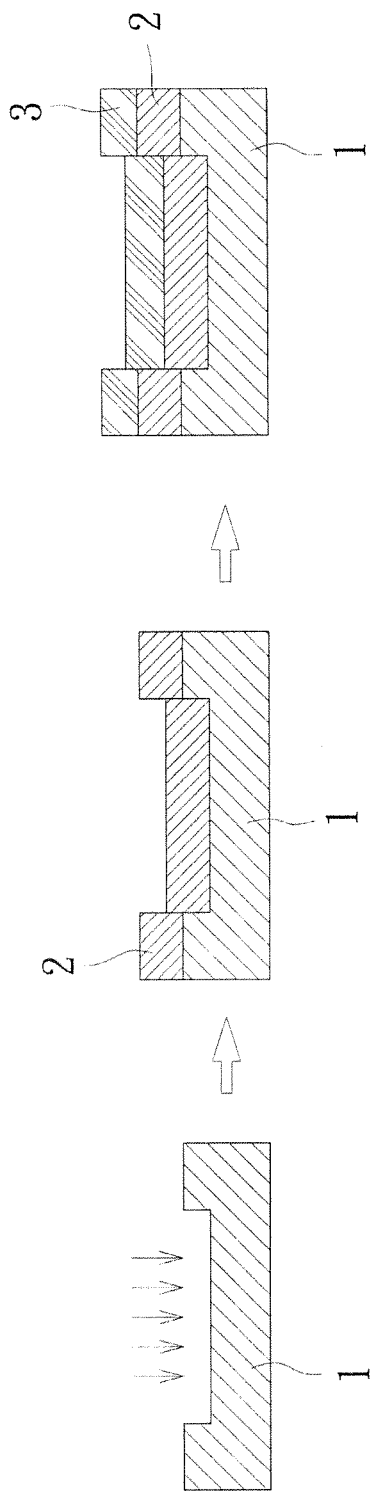
FIG. 4 is a flow chart showing steps of other embodiment of a manufacturing method of the organic solar cell according to the present invention.

Since the organic active layer 5 of the present invention is based on the sufficient thickness and flatness, if extending this idea, as long as a hole area has been created before coating the organic active layer 5, the organic active layer 5 has the characteristics of the thicker thickness and the flatter uniformity to reach effectively the objectives of the present invention. Please refer to FIG. 4, a flow chart showing the steps of other embodiment of a manufacturing method of the organic solar cell according to the present invention. It uses a dry etching process to define a hole area before coating the organic active layer 5. First define an area on the substrate 1 by a dry etching process, then deposit in order the first electrode 2 and the first transmission layer 3 on the substrate 1, final coat the organic active layer 5 on the surface of the first transmission layer 3 by the spin coater to reach thicker thickness and flatter uniformity characteristics of the organic active layer 5, and to reach effectively the objectives of the present invention.

Compared with techniques available now, the present invention has the following advantages:

1. The manufacturing method of the organic solar cell according to the present invention uses the structure formed by the photoresist layer to make an organic active layer coated on it to have thicker thickness by the surface tension and viscosity of the solution, thus the spin-coating speed can be raised to balance the thickness and flatness of the organic active layer.
2. The manufacturing method of the organic solar cell according to the present invention improves the thickness and the surface morphology of the organic layer, it is suitable to any organic materials, which has a high industrial applicability.
3. The light-emitting mechanism of the organic light emitting diode is opposite to the organic solar cell, so the present invention has the associated application in the organic light-emitting diode industry.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A manufacturing method for an organic solar cell comprising the steps of:
    step one: depositing in order a first electrode and a first transmission layer on a substrate;
    step two: coating a photoresist layer having a preferred thickness ranging from 1000 nm to 1600 nm on the surface of the first transmission layer by use of the spin coater at a preferred spin-coating speed ranging from 3000 rpm to 6000 rpm for 30 seconds;
    step three: developing an area by a photolithograph process;
    step four: coating an organic active layer in the area and on the surface of the photoresist layer by use of the spin coater at a preferred spin-coating speed ranging from 500 rpm to 800 rpm, in which the organic active layer has a thickness ranging from 230 nm to 320 nm at 500 rpm, and step five: depositing in order a second transmission layer and a second electrode on the organic active layer to obtain the organic solar cell.

2. The method as claimed in claim 1, wherein the current density of the organic solar cell is between 9 and 12 mA/cm$^2$.

3. The method as claimed in claim 1, wherein the device efficiency of the organic solar cell is between 3.17% and 3.85%.

4. The method as claimed in claim 1, wherein the first electrode is made of indium tin oxide (ITO).

5. The method as claimed in claim 1, wherein the first transmission layer is made of zinc oxide (ZnO).

6. The method as claimed in claim 1, wherein the organic active layer is blended with a conjugated polymer (P3HT) and a phenyl-C61-butyric acid methyl ester (PCBM).

7. The method as claimed in claim 1, wherein the second transmission layer is made of conductive polymer (PEDOT: PSS).

8. The method as claimed in claim 1, wherein the material of the second electrode is an anode used a silver ingot as the material coated by thermal evaporation.

9. An organic solar cell is manufactured by the method as claimed in claim 1.

* * * * *